(12) United States Patent
Hsieh

(10) Patent No.: US 11,495,759 B2
(45) Date of Patent: Nov. 8, 2022

(54) DISPLAY SUBSTRATE, MANUFACTURING METHOD THEREOF, AND DISPLAY APPARATUS

(71) Applicant: BOE TECHNOLOGY GROUP CO., LTD., Beijing (CN)

(72) Inventor: Changhan Hsieh, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 671 days.

(21) Appl. No.: 16/343,765

(22) PCT Filed: Jun. 27, 2018

(86) PCT No.: PCT/CN2018/093131
§ 371 (c)(1),
(2) Date: Apr. 21, 2019

(87) PCT Pub. No.: WO2019/134352
PCT Pub. Date: Jul. 11, 2019

(65) Prior Publication Data
US 2021/0336159 A1  Oct. 28, 2021

(30) Foreign Application Priority Data

Jan. 5, 2018  (CN) .......................... 201810012287.8

(51) Int. Cl.
*H01L 51/00*     (2006.01)
*H01L 27/32*     (2006.01)
(Continued)

(52) U.S. Cl.
CPC ...... *H01L 51/0097* (2013.01); *H01L 27/3244* (2013.01); *H01L 51/003* (2013.01);
(Continued)

(58) Field of Classification Search
CPC ......... H01L 2251/5338; H01L 51/5253; H01L 27/3246; H01L 51/0097
See application file for complete search history.

(56) References Cited

U.S. PATENT DOCUMENTS 10,121,834 B2 * 11/2018 Hsieh .................. H01L 51/5253
10,355,244 B2 *  7/2019 Sonoda ............... H01L 51/5256
(Continued)

FOREIGN PATENT DOCUMENTS

CN    104795424 A  *  7/2015  .......... G02F 1/1333
CN    104795424 A      7/2015

OTHER PUBLICATIONS

International Search Report in International application No. PCT/CN2018/093131, dated Sep. 27, 2018.
(Continued)

*Primary Examiner* — Jaehwan Oh
(74) *Attorney, Agent, or Firm* — Syncoda LLC; Feng Ma

(57) ABSTRACT

A display substrate includes a supporting material layer having at least one flexible material sub-layer and at least one blocking sub-layer, which can be alternately and successively arranged in layers. One blocking sub-layer is at a topmost sub-layer of the supporting material layer, and is provided with a well, located in a display area and configured for accommodating a display component therewithin. One or more of the at least one flexible material sub-layer or the at least one blocking sub-layer is configured as a target material layer. The target material layer includes a planar portion and a protruding portion over the planar portion. An orthographic projection of the protruding portion on a bottom surface of the supporting material layer forms a ring-like structure having an opening that covers an orthographic projection of a bottom surface of the well on the bottom surface of the supporting material layer.

14 Claims, 8 Drawing Sheets

(51) Int. Cl.
*H01L 51/56* (2006.01)
*C23C 14/06* (2006.01)
*C23C 14/10* (2006.01)

(52) U.S. Cl.
CPC .......... *H01L 51/56* (2013.01); *C23C 14/0641* (2013.01); *C23C 14/0676* (2013.01); *C23C 14/10* (2013.01); *H01L 2227/326* (2013.01); *H01L 2251/5338* (2013.01)

(56) References Cited

U.S. PATENT DOCUMENTS

| | | | |
|---|---|---|---|
| 2016/0072100 A1* | 3/2016 | Tsai | H01L 51/5246 257/40 |
| 2017/0062534 A1 | 3/2017 | Jiang et al. | |
| 2017/0155072 A1* | 6/2017 | Hashimoto | H01L 51/5072 |
| 2017/0155082 A1* | 6/2017 | Mu | H01L 51/5293 |
| 2017/0186971 A1* | 6/2017 | Kanamoto | H01L 51/0085 |
| 2017/0213872 A1* | 7/2017 | Jinbo | H01L 51/5246 |
| 2018/0233545 A1* | 8/2018 | Hsieh | H01L 51/5253 |
| 2019/0296260 A1* | 9/2019 | Li | H01L 51/56 |
| 2020/0194697 A1* | 6/2020 | Wu | H01L 51/5253 |

OTHER PUBLICATIONS

First Office Action in application No. 201810012287.8, dated Jan. 2, 2019.

* cited by examiner

DISPLAY SUBSTRATE, MANUFACTURING METHOD THEREOF, AND DISPLAY APPARATUS

CROSS-REFERENCE TO RELATED APPLICATION

The present application claims priority to Chinese Patent Application No. 201810012287.8 filed on Jan. 5, 2018, the disclosure of which is hereby incorporated by reference in its entirety.

TECHNICAL FIELD

The present disclosure relates generally to the field of display technologies, and more specifically to a display substrate, manufacturing method thereof and a display apparatus.

BACKGROUND

Flexible display substrates, because of the characteristics such as deformability and flexibility, have been widely utilized in curved televisions, curved mobile phones, and wearable devices.

In existing flexible display technologies, a conventional flexible display substrate typically comprises a flexible material such as polyimide (PI). In order to ensure the flexible display panel is water-proof and oxygen-proof, a blocking sub-layer having a composition of an inorganic material is first formed over the PI layer, and display components such as thin film transistors and signal lines may then be formed over the blocking sub-layer.

However, in existing technologies, the protecting effect of the blocking sub-layer to the display components in the flexible display substrate is sub-ideal.

SUMMARY

Embodiments of the present disclosure provide a display substrate, a manufacturing method thereof, and a display apparatus, aiming to solve the above mentioned problem in existing technologies that the protecting effect of the blocking sub-layer in the flexible display substrate to the display components is sub-ideal. The technical solutions provided by present disclosure are as follows.

In a first aspect, the present disclosure provides a display substrate.

The display substrate includes a supporting material layer having at least one flexible material sub-layer and at least one blocking sub-layer. It is configured such that one of the at least one blocking sub-layer is at a topmost sub-layer of the supporting material layer, and is provided with a well, located in a display area and configured for accommodating a display component therewithin.

According to some embodiments of the display substrate, the at least one flexible material sub-layer and the at least one blocking sub-layer are alternately and successively arranged in layers.

Optionally, one or more of the at least one flexible material sub-layer or the at least one blocking sub-layer is configured as a target material layer. The target material layer includes a planar portion and a protruding portion over the planar portion. It is configured such that an orthographic projection of the protruding portion on a bottom surface of the supporting material layer forms a ring-like structure having an opening that covers an orthographic projection of a bottom surface of the well on the bottom surface of the supporting material layer.

According to some embodiments of the display substrate, the target material layer is one of the at least one flexible material sub-layer.

Optionally, each of the at least one flexible material sub-layer above the target material layer is configured to have a substantially uniform thickness.

Optionally, each of the at least one blocking sub-layer above the target material layer is configured to have a substantially uniform thickness.

According to some embodiments of the display substrate, the supporting material layer comprises one flexible material sub-layer and one blocking sub-layer. It is configured such that the one flexible material sub-layer is the target material layer, and the one blocking sub-layer is provided with the well.

According to some embodiments of the display substrate, the supporting material layer comprises a first flexible material sub-layer, a first blocking sub-layer, a second flexible material sub-layer, and a second blocking sub-layer, successively arranged in layers. It is configured such that the second blocking sub-layer is provided with the well.

Optionally, in the above embodiments of the display substrate, the first flexible material sub-layer is configured as the target material layer. Alternatively, the second flexible material sub-layer is the target material layer.

In any embodiments of the display substrate described above, each of the at least one flexible material sub-layer comprises polyimide, and/or each of the at least one blocking sub-layer comprises at least one of silicon oxide, silicon nitride, or silicon oxynitride.

In a second aspect, the disclosure further provides a display apparatus.

The display apparatus includes a display substrate according to any one of the embodiments of the display substrate as described above.

The display apparatus further includes a display component, which can be arranged over the supporting material layer and within the well.

Optionally, a top surface of a sidewall of the well has a larger or substantially equal distance to a bottom surface of the well than a top surface of the display component.

In a third aspect, a method of manufacturing a display substrate is further provided. The method includes:

forming a supporting material layer over a base substrate, wherein the supporting material layer comprises at least one flexible material sub-layer and at least one blocking sub-layer, and one of the at least one blocking sub-layer is at a topmost sub-layer and is provided with a well located in a display area;

forming a display component over the supporting material layer and in the well; and removing the base substrate.

According to some embodiments of the method, the forming a supporting material layer over a base substrate comprises:

alternately and successively forming the at least one flexible material sub-layer and the at least one second blocking sub-layer over the base substrate.

According to some embodiments of the method, in the forming a supporting material layer over a base substrate, one or more of the at least one flexible material sub-layer, or the at least one blocking sub-layer is a target material layer.

As such, the forming a supporting material layer over a base substrate comprises a sub-step of forming a target material layer, comprising:

forming a planar portion over the base substrate; and forming a protruding portion over the planar portion, wherein an orthographic projection of the protruding portion on a bottom surface of the supporting material layer forms a ring-like structure having an opening that covers an orthographic projection of a bottom surface of the well on the bottom surface of the supporting material layer.

According to some embodiments of the method, in the forming a supporting material layer over a base substrate, one or more of the at least one flexible material sub-layer comprises polyimide. As such, the forming a supporting material layer over a base substrate comprises:

forming each of the one or more of the at least one flexible material sub-layer via a nozzle-coating process or a screen printing process.

According to some embodiments of method, in the forming a supporting material layer over a base substrate, one or more of the each of the at least one blocking sub-layer comprises at least one of silicon oxide, silicon nitride, or silicon oxynitride. As such, the forming a supporting material layer over a base substrate comprises:

forming each of the one or more of the at least one blocking sub-layer via a physical vapor deposition (PVD) process.

According to some embodiments of method, the removing the base substrate is performed via a laser lift-off process or a mechanical lift-off process.

Other embodiments may become apparent in view of the following descriptions and the attached drawings.

BRIEF DESCRIPTION OF THE DRAWINGS

To more clearly illustrate some of the embodiments, the following is a brief description of the drawings. The drawings in the following descriptions are only illustrative of some embodiments. For those of ordinary skill in the art, other drawings of other embodiments can become apparent based on these drawings.

DETAILED DESCRIPTION

In the following, with reference to the drawings of various embodiments disclosed herein, the technical solutions of the embodiments of the disclosure will be described in a clear and fully understandable way. It is obvious that the described embodiments are merely a portion but not all of the embodiments of the disclosure. Based on the described embodiments of the disclosure, those ordinarily skilled in the art can obtain other embodiment(s), which come(s) within the scope sought for protection by the disclosure.

In a first aspect, the present disclosure provides a display substrate. The display substrate includes a supporting material layer having at least one flexible material sub-layer and at least one blocking sub-layer. It is configured such that one of the at least one blocking sub-layer is at a topmost sub-layer of the supporting material layer, and is provided with a well, located in a display area and configured for accommodating a display component therewithin.

Figure 1:
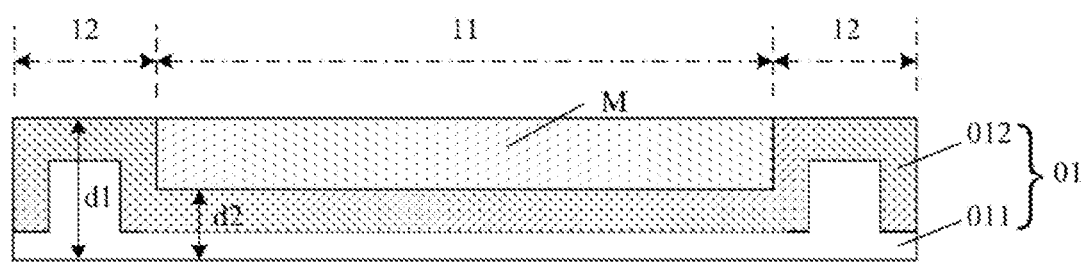
FIG. 1 is a structural diagram of a display substrate provided by some embodiments of the present disclosure.

FIG. 1 is a structural diagram of a display substrate provided by some embodiments of the present disclosure. As shown in FIG. 1, the display substrate comprises a supporting material layer 01.

The supporting material layer 01 specifically comprises a flexible material sub-layer 011 and a blocking sub-layer 012, which are arranged in layers. A display component M is further arranged over the blocking sub-layer 012.

Herein, the blocking sub-layer 012 can have a composition of an inorganic material. During use of the display substrate, things such as water and oxygen may pass through the flexible material sub-layer 011 and influence the display component M inside the display substrate. As such by configuring the blocking sub-layer 012 in the display substrate, a surface (i.e. the bottom surface as illustrated in FIG. 1) of the display component M that is close to the supporting material layer 01 can be protected. In addition, scratches on the supporting material layer 01 can be better prevented.

In the embodiments of the present disclosure, the supporting material layer 01 comprises a component region 11 and a surrounding region 12 that surrounds the component region 11, as indicated by the boxes with dotted lines in FIG. 1. The display component M is disposed within the component region 11.

As further indicated by FIG. 1, a thickness d1 of the portion of the supporting material layer 01 that is located within the surrounding region 12 is configured to be larger than a thickness d2 of the portion of the supporting material layer 01 that is located within the component region 11.

Herein, the display component M is disposed over the blocking sub-layer 012, and the display component M is arranged within the component region 11.

Because the thickness d1 of the portion of the supporting material layer 01 within the surrounding region 12 that surrounds the component region 11 is larger than the thickness d2 of the portion of the supporting material layer 01 within the component region 11, the blocking sub-layer 012 can also protect sidewalls of the display component M located within the component region 11 of the supporting material layer 01.

In summary, the display substrate disclosed herein substantially includes a supporting material layer 01. The supporting material layer 01 comprises a flexible material sub-layer 011 and a blocking sub-layer 012. The supporting material layer 01 is further configured to include a component region 11 and a surrounding region 12, wherein the surrounding region 12 is arranged to surround the component region 11, and the component region 11 is configured for arranging a display component M therein.

Because a thickness of a portion of the supporting material layer 01 within the surrounding region 12 is larger than a thickness of a portion of the supporting material layer 01 within the component region 11, the blocking sub-layer 012 not only can protect a surface of the display component M that is close to the supporting material layer 01, but also can protect sidewalls of the display component M. As such, the blocking sub-layer 012 in the display substrate disclosed herein can realize a better protection of the display component M.

Herein and throughout the disclosure, the display component is referred to as an assembly of elements for display functionality, which can comprise a light-emitting element (such as organic light-emitting diodes (OLEDs)), TFTs, signal lines, or driving circuits, and so on.

Figure 2:
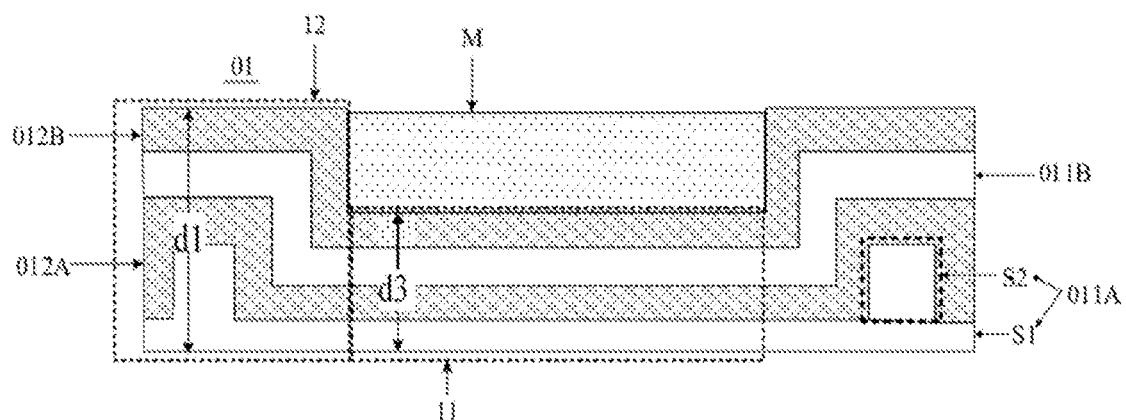
FIG. 2 is a structural diagram of a display substrate provided by some other embodiments of the present disclosure.

FIG. 2 illustrates a structural diagram of a display substrate according to some other embodiments of the present disclosure. As illustrated in FIG. 2, the supporting material layer 01 comprises a plurality of flexible material sub-layers 011 and a plurality of blocking sub-layers 012, all arranged in layers.

One blocking sub-layer 012 is configured between each pair of adjacent flexible material sub-layers 011, and one flexible material sub-layer 011 is configured between each pair of adjacent blocking sub-layers 012. Through the above configuration of the plurality of blocking sub-layers 012, the protection of the display component can be further improved.

Specifically in the embodiments as shown in FIG. 2, the supporting material layer 01 comprises a first flexible material sub-layer 011A, a first blocking sub-layer 012A, a second flexible material sub-layer 011B, and a second blocking sub-layer 012B, which are sequentially arranged in layers (i.e. as successively shown in a direction from bottom to top in FIG. 2).

Through the above configuration of a total of two blocking sub-layers 012A and 012B, the display component M can be better protected by the blocking sub-layers 012A and 021B. In addition, there is no need to increase the thickness of the display substrate, and the difficulties of the manufacturing process thereof are also not increased too much.

In the above embodiments of the display substrate illustrated in FIG. 2, at least one of the plurality of flexible material sub-layers 011 or the plurality of blocking sub-layers 012 is configured as a target material layer. In other words, one, or more than one, of the plurality of flexible material sub-layers 011 or of the plurality of blocking sub-layers 012 are configured as target material layers.

Figure 3:
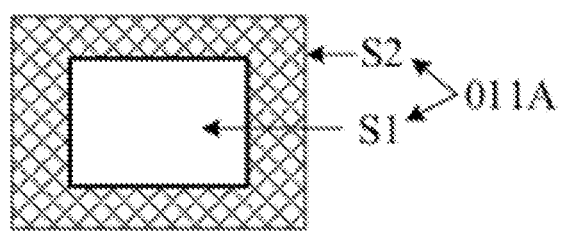
FIG. 3 is a top view of a display substrate shown in FIG. 2.

According to some embodiments as illustrated in FIG. 2 and FIG. 3, the first flexible material sub-layer 011A is configured as the target material layer. FIG. 3 is a top view of the first flexible material sub-layer 011A. With reference to FIG. 2 and FIG. 3, it can be seen that the target material layer comprises a planar portion S1 and a protruding portion S2. The planar portion S1 is configured to cover the component region 11 and the surrounding region 12. The protruding portion S2 is ring-shaped, located within the surrounding region 12, and is arranged at a side of the planar portion S1 that is close to the display component M.

In the embodiments as specifically shown in FIG. 3, the shape of the protruding portion S2 located within the surrounding region 12 is a square ring. However, it should be noted that other shapes are also possible.

Correspondingly, as shown in FIG. 2, it is further configured such that a thickness of a portion of the first blocking sub-layer 012A within the surrounding region 12 is substantially equal to a thickness of a portion of the first blocking sub-layer 012A within the component region 11; a thickness of a portion of the second flexible material sub-layer 011B within the surrounding region 12 is substantially equal to the thickness of a portion of the flexible material sub-layer 011B within the component region 11; and a thickness of a portion of the second blocking sub-layer 012B within the surrounding region 12 is substantially equal to a thickness of a portion of the second blocking sub-layer 012B within the component region 11.

As such, in the embodiments of the display substrate described above and illustrated in FIG. 2 and FIG. 3, by configuring the first flexible material sub-layer 011A as the target material layer, the manufacturing process of the display substrate can be simplified.

Further in the embodiments of the display substrate as illustrated in FIG. 2, the sum d3 of a thickness of a portion of the supporting material layer 01 located within the component region 11 and a thickness of the display component M is configured to be smaller than a thickness d1 of a portion of the supporting material layer 01 that is located within the surrounding region 12, that is, d3<d1. As a result, the display component M is completely located within the component region 11 of the supporting material layer 01, thereby the protection of the display component M is further improved.

It is noted that in some other embodiments of the display substrate, the target material layer can also be any one of the first blocking sub-layer 012A, the second flexible material sub-layer 011B, or the second blocking sub-layer 012B.

Figure 4:
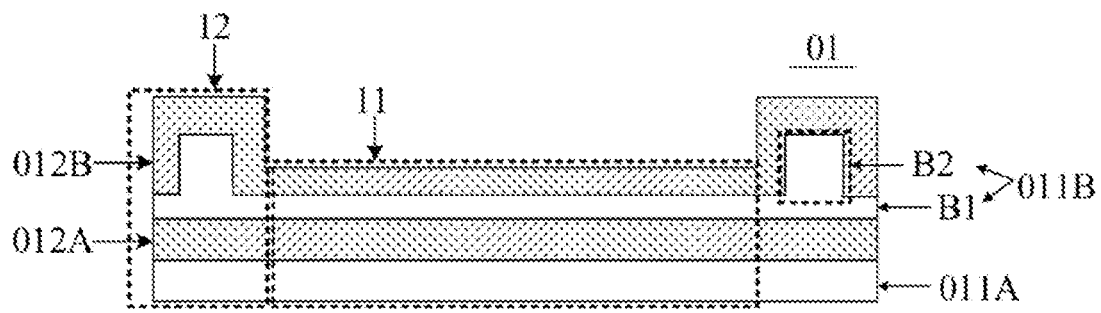
FIG. 4 is a structural diagram of a display substrate provided by yet some other embodiments of the present disclosure.

For example, in the embodiments as shown in FIG. 4, the target material layer is the second flexible material sub-layer 011B. The second material layer 011B thus comprises a planar portion B1 that covers the component region 11 and the surrounding region 12, and a ring-shaped protruding portion B2 that is located within the surrounding region 12 and arranged at the side of the planar portion B1 that is close to the display component.

Correspondingly, in these above embodiments of the display substrate as illustrated in FIG. 4, the first flexible material sub-layer 011A has substantially equal thicknesses for a portion thereof located within the component region 11 and another portion thereof located within the surrounding region 12; the first blocking sub-layer 012A has substantially equal thicknesses for a portion thereof located within the component region 11 and another portion thereof located within the surrounding region 12; and a thickness of a portion of the second blocking sub-layer 012B located within the surrounding region 12 and a thickness of a portion of the second blocking sub-layer 012B located within the component region 11 are substantially equal.

In any one of the embodiments as described above and illustrated in FIGS. 1, 2, and 4, at least one of the at least one flexible material sub-layer and the at least one blocking sub-layer is configured as a target material layer. For example, the blocking sub-layer 011 in the embodiments illustrated in FIG. 1, the first blocking sub-layer 011A in the embodiments illustrated in FIG. 2, and the second blocking sub-layer 011B in the embodiments illustrated in FIG. 4, are respectively configured as the target material layer.

Throughout the disclosure, a component region is defined as a region of the supporting material layer whose orthographic projection on a plane that is substantially parallel to the supporting material layer (such as the bottom surface of the flexible material sub-layer 011 in FIG. 1, the bottom surface of planar portion S1 of the flexible material sub-layer 011A in FIG. 2, or the bottom surface of the flexible material sub-layer 011A in FIG. 4) covers an orthographic projection of a display component M on the same plane. A surrounding region is defined as a region of the supporting material layer that surrounds the component region, i.e. whose orthographic projection on the above mentioned plane surrounds the orthographic projection of the component region on the same plane).

Throughout the disclosure, a target material layer is defined as a sub-layer in the supporting material layer that comprises a planar portion and a protruding portion, wherein the planar portion of the target material layer is configured to cover the component region and the surrounding region of the supporting material layer (i.e. an orthographic projection of the planar portion of the target material layer on the base substrate is arranged to cover an orthographic projection of the component region and the surrounding region on the base substrate), and the protruding portion of the target material layer is configured to form a ring-like structure to surround the component region of the supporting material layer (i.e. an orthographic projection of the protruding portion of the target material layer on the base substrate forms a ring-like structure having an inside opening covering an orthographic projection of the component region of the supporting material layer on the base substrate).

It is noted that in any one of the embodiments of the display substrate as described above, the material for the flexible material sub-layer 011 (as illustrated in FIG. 1) or for any one of the plurality of flexible material sub-layers 011 (i.e. 011A and 011B as illustrated in FIG. 2 or FIG. 4) can comprise a polyimide (PI) material. The PI material has properties such as high-temperature resistance, low-temperature resistance, and anti-oxidation.

It is further noted that in any one of the embodiments of the display substrate as described above, the material for the flexible material sub-layer 011 (as illustrated in FIG. 1) or for any one of the plurality of flexible material sub-layers 011 (as illustrated in FIG. 2 or FIG. 4) can comprise an inorganic material. For example, the inorganic material may comprise at least one of silicon oxide, silicon nitride, or silicon oxynitride. A blocking sub-layer 012 made of an inorganic material can protect the display component M and ensure that the display substrate is water-proof, oxygen-proof and scratch-proof.

In summary, in the first aspect of the present disclosure, a display substrate comprises a supporting material layer and a display component. The supporting material layer comprises at least one flexible material sub-layer and at least one blocking sub-layer, and the display component is disposed on one of the at least one blocking sub-layer. The supporting material layer comprises a component region and a surrounding region. The component region is configured to arrange a display component therein, and the surround region is configured to surround the component region.

Because a thickness of the portion of the supporting material layer within the surrounding region is larger than the thickness of the portion of the supporting material layer within the component region, and the display component is arranged within the component region, the at least one blocking sub-layer not only can protect the surface of the display component that is close to the supporting material layer, but also can protect the sidewalls of the display component. As such, the display component in the display substrate can be better protected.

In a second aspect, the present disclosure further provides a method of manufacturing a display substrate.

Figure 5A:
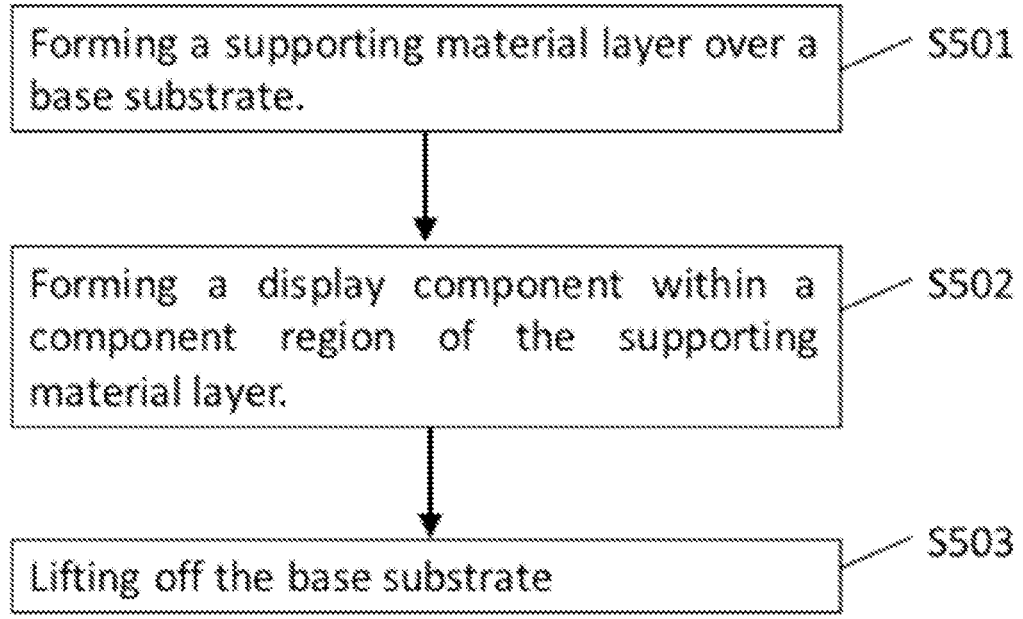
FIG. 5A is a flow chart of a manufacturing method of a display substrate provided by some embodiments of the present disclosure.

FIG. 5A is a flow chart illustrating the manufacturing method of the display substrate provided by some embodiments of the present disclosure. As shown in FIG. 5, the method comprises the steps S501-S503:

S501: Forming a supporting material layer over a base substrate.

Herein, the supporting material layer can comprise at least one flexible material sub-layer and at least one blocking sub-layer, alternately arranged in layers; the supporting material layer comprises a component region and a surrounding region that surrounds the component region; a thickness of the portion of the supporting material layer located within the surrounding region is larger than a thickness of the portion of the supporting material layer located within the component region.

S502: Forming a display component within a component region of the supporting material layer.

Herein, the display component may be formed at the component region of the supporting material layer. Because the thickness of the portion of the supporting material layer located within the surrounding region is larger than the thickness of the portion of the supporting material layer located within the component region, one or more of the at least one blocking sub-layer in the supporting material layer can protect the side wall of the display component and further extend the working life of the display substrate. Herein, the display component may comprise one or more thin film transistors, one or more signal lines, and one or more driving circuits and so on.

S503: Lifting off the base substrate.

After the display component is formed within the component region of the supporting material layer, the base substrate can be further removed in step S503 through a laser lift-off process or a mechanical lift-off process, to thereby obtain the display substrate.

As such, in the display substrate obtained by the manufacturing method described above, the supporting material layer substantially comprises at least one flexible material sub-layer and at least one blocking sub-layer; and the supporting material layer comprises a component region and a surrounding region. Because the thickness of the portion of the supporting material layer within the surrounding region is larger than the thickness of the portion of the supporting material layer within the component region, and the display component is arranged at the component region, the at least one blocking sub-layer in the supporting material layer not only can protect a surface of the display component that is close to the supporting material layer, but also can protect sidewalls of the display component. Thereby, the at least one blocking sub-layer in the supporting material layer in the display substrate can provide a better protection to the display component.

According to some embodiments of the present disclosure, the supporting material layer can comprise one flexible material sub-layer and one blocking sub-layer, as illustrated in FIG. 1.

According to some other embodiments of the present disclosure, the supporting material layer can include a plurality of flexible material sub-layers and a plurality of blocking sub-layers, as illustrated in FIG. 2 and FIG. 4, which can be formed alternately and successively over the base substrate. In other words, one blocking sub-layer is successively formed between each pair of adjacent flexible material sub-layers, and one flexible material sub-layer is formed between each pair of adjacent blocking sub-layers. Thereby, through forming a plurality of blocking sub-layers, the display component can be better protected.

For example, in the embodiments illustrated in FIG. 2, a first flexible material sub-layer 011A, a first blocking sub-layer 012A, a second flexible material sub-layer 011B and a second blocking sub-layer 012B are formed successively over the base substrate as the supporting material layer 01. Herein, though forming two blocking sub-layers (i.e. 012A and 012B), the display component disposed in the supporting material layer 01 can be better protected, and additionally, it can further avoid an increase of a thickness of the display substrate, and avoid an increase of the difficulties of the manufacturing process of the display substrate.

In any one of the embodiments as described above, at least one of the at least one flexible material sub-layer and the at least one blocking sub-layer is configured as a target material layer.

It is configured that the target material layer comprises a planar portion and a protruding portion, such that the planar portion covers the component region and the surrounding region of the supporting material layer (i.e. an orthographic projection of the planar portion of the target material layer on the base substrate is arranged to cover an orthographic projection of the component region and the surrounding region on the base substrate).

It is further configured such that the protruding portion forms a ring-like structure surrounding the component region of the supporting material layer (i.e. an orthographic projection of the protruding portion of the target material layer on the base substrate forms a ring-like structure having an inside opening covering an orthographic projection of the component region of the supporting material layer on the base substrate).

As such, the step S501 of forming a supporting material layer over a base substrate comprises a sub-step of:

S5010: Forming a target material layer over the base substrate.

Figure 5B:
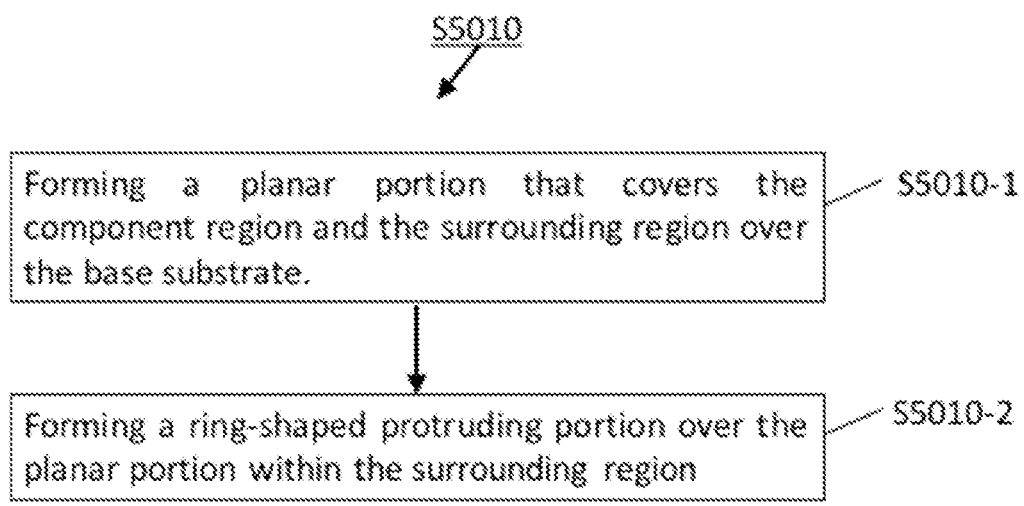
FIG. 5B is a flow chart of forming a target material layer over the base substrate according to some embodiments of the present disclosure.

Specifically, as illustrated in FIG. 5B, the sub-step S5010 comprises the following sub-steps:

S5010-1: Forming a planar portion that covers the component region and the surrounding region over the base substrate; and S5010-2: Forming a ring-shaped protruding portion over the planar portion within the surrounding region.

Figure 6:
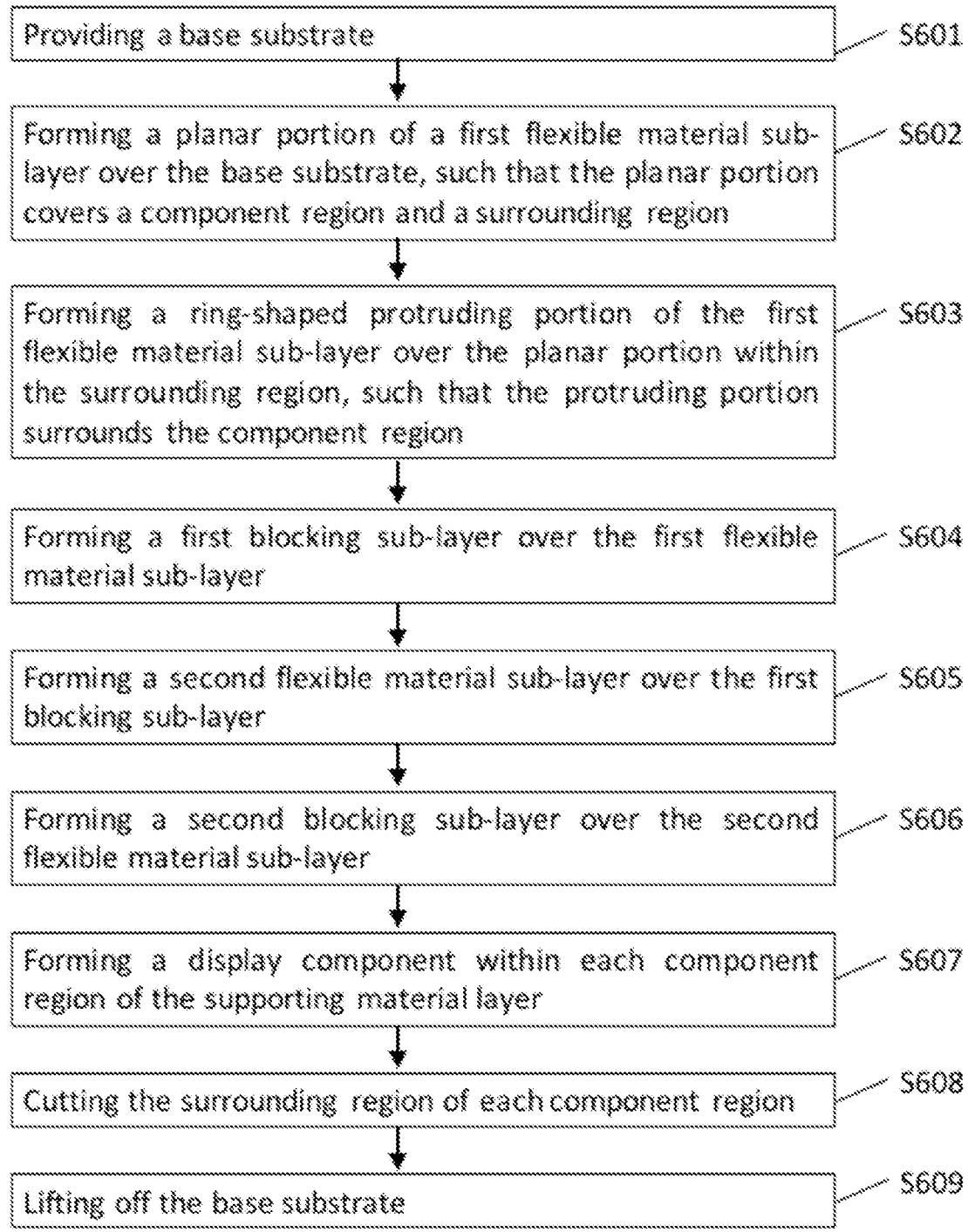
FIG. 6 is a flow chart of a manufacturing method of another display substrate provided by embodiments of the present disclosure.

FIG. 6 illustrates a specific method for manufacturing the display substrate as illustrated in FIG. 2, where the target material layer is the first flexible material sub-layer 011A.

As shown in FIG. 6, the manufacturing method of the display substrate comprises the following steps S601-S609:

S601: Providing a base substrate.

Herein, a base substrate is provided as a support, over which the supporting material layer and the display component can be formed. The base substrate can be a glass substrate, but can also be another material.

S602: Forming a planar portion of a first flexible material sub-layer over the base substrate, such that the planar portion covers a component region and a surrounding region.

Herein, the component region is defined as a region configured for arranging the display component therewithin, and the surrounding region is defined as a region configured to surround the component region.

Furthermore, the planar portion can have a composition of PI material. As such, a PI material of a uniform thickness can be coated over the component region and the surrounding region of the base substrate through a nozzle-coating process or a screen printing process, to thereby form the planar portion of the first flexible material sub-layer.

Figure 7:
FIG. 7 is a diagram illustrating the formation of a planar portion over a base substrate provided by embodiments of the present disclosure.

Specifically, the base substrate 10 and the planar portion S1 formed over the base substrate 10, after step S602, are shown in FIG. 7.

S603: Forming a ring-shaped protruding portion of the first flexible material sub-layer over the planar portion within the surrounding region, such that the protruding portion surrounds the component region.

Herein, by means of step S603, the ring-shaped protruding portion can be formed through a patterning process at the surrounding region of the planar portion. The planar portion and the ring-shaped protruding portion can together form the first flexible material sub-layer. The ring-shaped protruding portion is configured to surround the display component disposed within the component region in the display substrate, and the display component is therefore protected. Herein, the patterning process can comprise a nozzle-coating or a screen printing.

Figure 8:
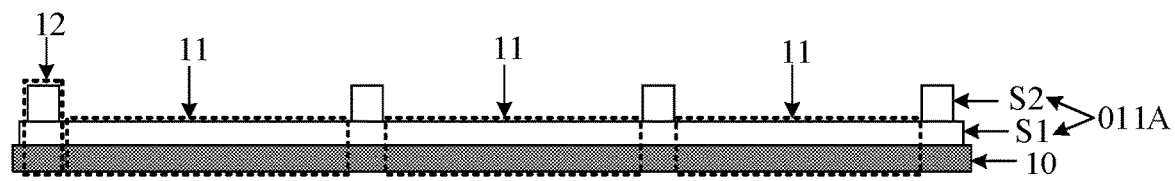
FIG. 8 is a diagram illustrating the formation of a protruding portion over a planar layer provided by embodiments of the present disclosure.

Specifically, the diagram of the ring-shaped protruding portion S2 formed over the planar portion at the surrounding region, after step S603, is illustrated in FIG. 8. The planar portion S1 and the ring-shaped protruding portion S2 together forms the first flexible material sub-layer 011A.

It should be noted that in order to improve the efficiency of the manufacturing process of the display substrate, the base substrate 10 provided in step 601 can be configured to have a relatively large area to thereby allow the manufacturing of more than one display substrates, and therefore, the base substrate 10 can be called a mother board.

Figure 9:
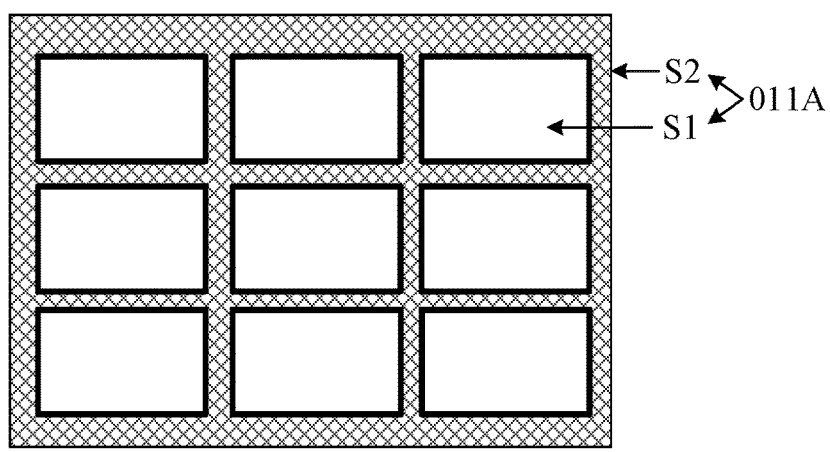
FIG. 9 is a top view of a display substrate provided by embodiments of the present disclosure.

Correspondingly, as shown in FIG. 8 and FIG. 9, the formation of the first flexible material sub-layer 011A over the base substrate 10 may comprise a plurality of component regions 11 and a plurality of surrounding regions 12 that surrounds each component region 11. In addition, the plurality of component regions 11 may be arranged in the form of an array.

S604: Forming a first blocking sub-layer over the first flexible material sub-layer.

Herein, the first blocking sub-layer can have a composition of an inorganic material, and the first blocking sub-layer can be of a uniform thickness. As such, an inorganic material of uniform thickness can be formed over a surface of the first flexible material sub-layer 011A that is far away from the base substrate 10 through a physical vapor deposition (PVD) process, to thereby form the first blocking sub-layer 012A. The inorganic materials can be at least one of silicon oxide, silicon nitride, or silicon oxynitride.

Figure 10:
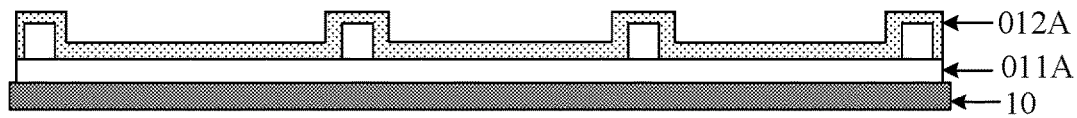
FIG. 10 is a diagram of the formation of the first blocking sub-layer provided by embodiments of the present disclosure.

FIG. 10 specifically illustrates the formation of the first blocking sub-layer 012A covering each component region and surrounding region of the base substrate after step S604.

S605: Forming a second flexible material sub-layer over the first blocking sub-layer.

After step S605, the second flexible material sub-layer 011B can be formed over a surface of the first blocking sub-layer 012A that is far away from the base substrate 10. Herein, the second flexible material sub-layer 011B can be formed by nozzle-coating the PI material, and the second flexible material sub-layer 011B can be of a uniform thickness.

Figure 11:
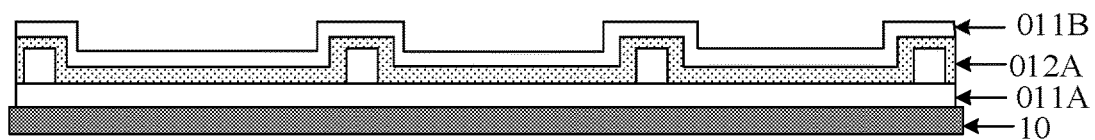
FIG. 11 is a diagram of the formation of the second flexible material sub-layer provided by embodiments of the present disclosure.

Specifically, as illustrated in FIG. 11, the second flexible material sub-layer 011B is formed to thereby cover each component region and surrounding region over the base substrate after step S605.

S606: Forming a second blocking sub-layer over the second flexible material sub-layer.

Figure 12:
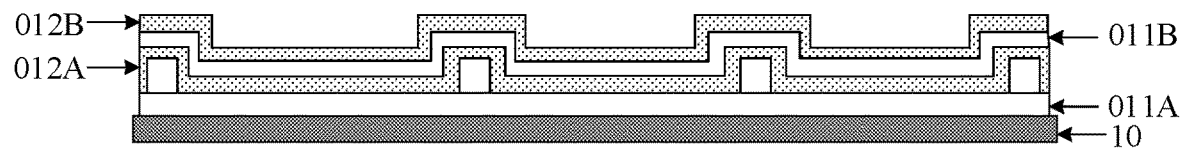
FIG. 12 is a diagram of the formation of the second blocking sub-layer provided by embodiments of the present disclosure.

As specifically illustrated in FIG. 12, a second blocking sub-layer 012B can be formed over a surface of the second flexible material sub-layer 011B that is far away from the base substrate 10. Herein, the second blocking sub-layer 012B that is formed in step S606 can be of a uniform thickness, and the specific formation process in step S606 can be referenced to the process of forming the first blocking sub-layer 012A in aforementioned step 604.

Herein, the first flexible sub-layer 011A, the first blocking sub-layer 012A, the second flexible material sub-layer 011B, and the second blocking sub-layer 012B that are successively disposed over the base substrate 10 together form the supporting material layer, which is configured to support one or more display components in the display substrate.

S607: Forming a display component within each component region of the supporting material layer.

Figure 13:
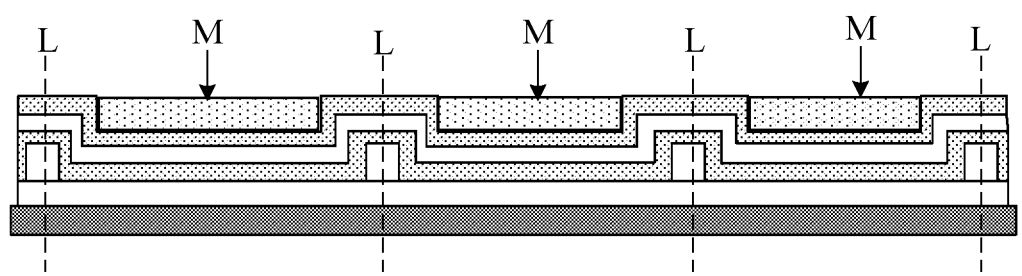
FIG. 13 is a diagram of the formation of the display component provided by embodiments of the present disclosure.

As specifically illustrated in FIG. 13, the supporting material layer comprises a plurality of component regions that are spaced from one another, and a display component M can be formed within each component region in the supporting material layer through a patterning process.

Herein, the display component can comprise TFTs, signal lines or driving circuits, and so on. Additionally, the patterning process employed for forming the display component may comprise a photo etching process, and so on. There are no limitations herein.

S608: Cutting the surrounding region of each component region.

Herein, as specifically illustrated in FIG. 13, by means of step S608, the base substrate 10 and the surrounding region of each component region of the supporting material layer over the base substrate 10 can be severed or cut along the dotted lines L. Specifically, cutting in step S608 can be performed through a laser cutting process or a mechanical cutting process.

S609: Lifting off the base substrate.

Figure 14:
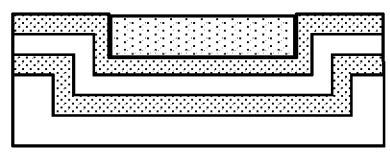
FIG. 14 is a structural diagram of yet another display substrate provided by embodiments of the present disclosure.

In step S609, the base substrate in each display substrate to be lifted off can be lifted off through a laser lift-off process or a mechanical lift-off process to thereby obtain a plurality of display substrates. The specific structure of each of the plurality of display substrates is illustrated in FIG. 14.

It should be noted that the above specific steps S601-S608 in the method for manufacturing the display substrate serve as illustrating purpose only, and do not impose a limitation to the scope of the disclosure. The specific order of the steps in the manufacturing method as described above may be changed or modified, new steps may be added, and/or some steps may be bypassed according to different situations. There are no limitations herein.

In summary, the present disclosure provides a display substrate and its manufacturing method. The display substrate comprises a supporting material layer and a display component. In the display substrate, the supporting material layer comprises at least one flexible material sub-layer and at least one blocking sub-layer, and the display component is disposed on one of the at least one blocking sub-layer. The supporting material layer comprises a component region and a surrounding region. The component region is configured to arranged a display component therein, and the surround region is configured to surround the component region.

Because a thickness of the portion of the supporting material layer within the surrounding region is larger than the thickness of the portion of the supporting material layer within the component region, and the display component is arranged within the component region, the at least one blocking sub-layer not only can protect the surface of the display component that is close to the supporting material layer, but also can protect the sidewalls of the display component. As such, the display component in the display substrate can be better protected.

In a third aspect, the present disclosure further provides a display apparatus.

The display apparatus comprises the display substrate according to any of the embodiments as described above. Herein, the display apparatus can be any products or components that have a display function. Examples of the display apparatus include liquid crystal display (LCDs) panels, electronic papers, organic light-emitting diode (OLED) display panels, AMOLED panels, mobile phones, tablets, televisions, monitors, laptops, digital frames, or navigators.

All references cited in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A display substrate, comprising a supporting material layer having at least one flexible material sub-layer and at least one blocking sub-layer, wherein:
   one of the at least one blocking sub-layer is at a topmost sub-layer of the supporting material layer, and is provided with a well, located in a display area and configured for accommodating a display component therewithin; and
   each of the at least one flexible material sub-layer comprises polyimide.

2. The display substrate of claim 1, wherein the at least one flexible material sub-layer and the at least one blocking sub-layer are alternately and successively arranged in layers.

3. The display substrate of claim 2, wherein one or more of the at least one flexible material sub-layer or the at least one blocking sub-layer is a target material layer, wherein the target material layer comprises:

a planar portion; and a protruding portion over the planar portion;

wherein:

an orthographic projection of the protruding portion on a bottom surface of the supporting material layer forms a ring-like structure having an opening that covers an orthographic projection of a bottom surface of the well on the bottom surface of the supporting material layer.

4. The display substrate of claim 3, wherein the target material layer is one of the at least one flexible material sub-layer.

5. The display substrate of claim 4, wherein each of the at least one flexible material sub-layer above the target material layer has a substantially uniform thickness.

6. The display substrate of claim 4, wherein each of the at least one blocking sub-layer above the target material layer has a substantially uniform thickness.

7. The display substrate of claim 4, wherein the supporting material layer comprises one flexible material sub-layer and one blocking sub-layer, wherein:

the one flexible material sub-layer is the target material layer; and the one blocking sub-layer is provided with the well.

8. A display substrate, comprising a supporting material layer having at least one flexible material sub-layer and at least one blocking sub-layer, wherein:

one of the at least one blocking sub-layer is at a topmost sub-layer of the supporting material layer, and is provided with a well, located in a display area and configured for accommodating a display component therewithin;

the at least one flexible material sub-layer and the at least one blocking sub-layer are alternately and successively arranged in layers; and one or more of the at least one flexible material sub-layer or the at least one blocking sub-layer is a target material layer, wherein the target material layer comprises:

a planar portion; and a protruding portion over the planar portion;

wherein:

an orthographic projection of the protruding portion on a bottom surface of the supporting material layer forms a ring-like structure having an opening that covers an orthographic projection of a bottom surface of the well on the bottom surface of the supporting material layer;

the target material layer is one of the at least one flexible material sub-layer; and wherein the supporting material layer comprises a first flexible material sub-layer, a first blocking sub-layer, a second flexible material sub-layer, and a second blocking sub-layer, successively arranged in layers, wherein:

the second blocking sub-layer is provided with the well.

9. The display substrate of claim 8, wherein the first flexible material sub-layer is the target material layer.

10. The display substrate of claim 8, wherein the second flexible material sub-layer is the target material layer.

11. A display substrate, comprising a supporting material layer having at least one flexible material sub-layer and at least one blocking sub-layer, wherein:

one of the at least one blocking sub-layer is at a topmost sub-layer of the supporting material layer, and is provided with a well, located in a display area and configured for accommodating a display component therewithin; and wherein each of the at least one blocking sub-layer comprises at least one of silicon oxide, silicon nitride, or silicon oxynitride.

12. A display apparatus, comprising the display substrate according to claim 1.

13. The display apparatus of claim 12, further comprising a display component, wherein the display component is arranged over the supporting material layer and within the well.

14. The display apparatus of claim 13, wherein a top surface of a sidewall of the well has a larger or substantially equal distance to a bottom surface of the well than a top surface of the display component.

* * * * *